(12) United States Patent
Wunderlich et al.

(10) Patent No.: US 12,332,306 B2
(45) Date of Patent: Jun. 17, 2025

(54) APPARATUS AND METHOD FOR IMPLEMENTING A SCALABLE DIGITAL INFRASTRUCTURE FOR MEASURING RING OSCILLATORS

(71) Applicant: TOKYO ELECTRON U.S. HOLDINGS, INC., Austin, TX (US)

(72) Inventors: Richard Wunderlich, Austin, TX (US); Joseph S. Spector, Austin, TX (US); Brian Degnan, Enfield, NH (US); Patrick G. Drennan, Gilbert, AZ (US)

(73) Assignee: TOKYO ELECTRON U.S. HOLDINGS, INC., Austin, TX (US)

(*) Notice: Subject to any disclaimer, the term of this patent is extended or adjusted under 35 U.S.C. 154(b) by 0 days.

(21) Appl. No.: 17/848,934

(22) Filed: Jun. 24, 2022

(65) Prior Publication Data
US 2022/0413045 A1 Dec. 29, 2022

Related U.S. Application Data

(60) Provisional application No. 63/215,044, filed on Jun. 25, 2021.

(51) Int. Cl.
*G06F 1/12* (2006.01)
*G01R 31/317* (2006.01)
*G01R 31/3185* (2006.01)

(52) U.S. Cl.
CPC ............ *G01R 31/31726* (2013.01); *G01R 31/318516* (2013.01); *G01R 31/318527* (2013.01); *G06F 1/12* (2013.01)

(58) Field of Classification Search
CPC ...... G01R 31/318516; G01R 31/31726; G01R 31/318527
See application file for complete search history.

(56) References Cited

U.S. PATENT DOCUMENTS 4,827,157 A * 5/1989 Machida ............. H03K 5/1515
327/295
6,118,699 A 9/2000 Tatsumi et al.
(Continued)

FOREIGN PATENT DOCUMENTS

| GB | 2445829 A | 7/2008 |
|---|---|---|
| WO | WO-2006122271 A2 | 11/2006 |
| WO | WO-2022272029 A1 | 12/2022 |

OTHER PUBLICATIONS

International Search Report and Written Opinion for PCT Application No. PCT/US2022/34851, mailed Oct. 26, 2022, 9 pages.

*Primary Examiner* — Alesa Allgood
(74) *Attorney, Agent, or Firm* — Oblon, McClelland, Maier & Neustadt, L.L.P.

(57) ABSTRACT

An apparatus has a collection of ring oscillators. An instruction register block is configured to sequentially address and activate each ring oscillator in the collection of ring oscillators. A multiplexer with input lines is connected to each ring oscillator in the collection of ring oscillators and an output line. A pulse counter is connected to the output line of the multiplexer to count the number of oscillations of a selected ring oscillator within a selected time period to form a multiple bit frequency count output signal. A data shift register receives the multiple bit frequency count output signal and produces a serial frequency count output signal.

20 Claims, 19 Drawing Sheets

(56) References Cited

U.S. PATENT DOCUMENTS

| | | | |
|---|---|---|---|
| 6,594,275 B1* | 7/2003 | Schneider | H04L 1/244 |
| | | | 370/537 |
| 6,989,551 B2 | 1/2006 | Gunther et al. | |
| 2004/0251973 A1* | 12/2004 | Ishida | H03K 3/0322 |
| | | | 331/16 |
| 2005/0210179 A1* | 9/2005 | Walmsley | G06F 21/445 |
| | | | 711/3 |
| 2005/0231399 A1* | 10/2005 | Fowler | H03M 9/00 |
| | | | 341/100 |
| 2008/0136641 A1* | 6/2008 | Kean | G01R 31/31707 |
| | | | 257/E23.179 |

* cited by examiner

APPARATUS AND METHOD FOR IMPLEMENTING A SCALABLE DIGITAL INFRASTRUCTURE FOR MEASURING RING OSCILLATORS

CROSS-REFERENCE TO RELATED INVENTION

This application claims priority to U.S. Provisional Patent Application Ser. No. 63/215,044, filed Jun. 25, 2021, the contents of which are incorporated herein by reference.

FIELD OF THE INVENTION

This invention generally relates to the testing of semiconductor wafers. More specifically, this invention relates to techniques for implementing a scalable digital infrastructure for measuring ring oscillators in wafer scribe lines.

BACKGROUND OF THE INVENTION

FIG. 1 illustrates a known semiconductor wafer testing system including test equipment 100 connected to a probe card 102, which makes connections with pads on a wafer 104. FIG. 2 illustrates a semiconductor wafer 104 with individual chips 200. The individual chips 200 form rows and columns of chips which are separated by scribe lines 202. Within scribe line 202 there are test circuits 204. The test circuits 204 are used during wafer level testing. When testing is completed, a saw is used to cut the regions of the scribe lines to divide the individual chips for subsequent packaging. This cutting process destroys the test circuits 204 in the scribe lines. FIG. 3 illustrates a simple test circuit with a gate pad 300, a source pad 302 and a drain pad 304. A probe card needle 306 is connected to the drain pad 304.

FIG. 4 illustrates a prior art ring oscillator 400. The ring oscillator 400 has a logical NAND gate 402 operative as an enable stage followed by an odd number of inverters, in this case, 404_1, 404_2 and 404_3 to produce an output Q. A feedback loop 406 returns the output signal to the enable stage 402. The output signal oscillates between a digital one (high) and digital zero (low). The frequency of the oscillations depends on the time delay of all stages. The frequency of the ring oscillator is captured by the number of toggles between digital high and digital low for a defined time period.

Ring oscillators are test circuits that are placed in scribe lines 202 of a wafer 104 and/or in individual chips 200 of a wafer 104. They are used to gain insight into a fabrication process's power, performance, area and yield. Performance correlates with the measured frequency. Power is correlated to the measured current. Yield is evaluated by statistical variations of many sampled ring oscillators.

A single ring oscillator cannot cover all sources of process variation, nor can one decouple the source of variation from a single ring oscillator or even a small set of ring oscillators. Instead, what is required are dozens of ring oscillators that vary incrementally over a large set of dimensions. Such an infrastructure needs to be fast, robust to extreme process variation and needs to produce trustworthy data. The disclosure herein addresses these issues.

SUMMARY OF THE INVENTION

An apparatus has a collection of ring oscillators. An instruction register block is configured to sequentially address and activate each ring oscillator in the collection of ring oscillators. A multiplexer with input lines is connected to each ring oscillator in the collection of ring oscillators and an output line. A pulse counter is connected to the output line of the multiplexer to count the number of oscillations of a selected ring oscillator within a selected time period to form a multiple bit frequency count output signal. A data shift register receives the multiple bit frequency count output signal and produces a serial frequency count output signal.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
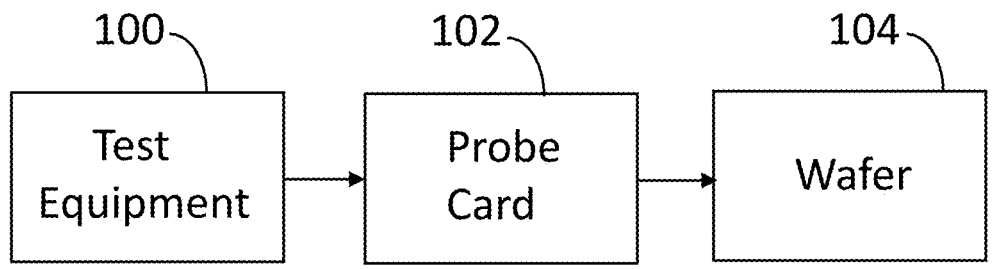
FIG. 1 illustrates a semiconductor wafer testing system known in the prior art.
Figure 2:
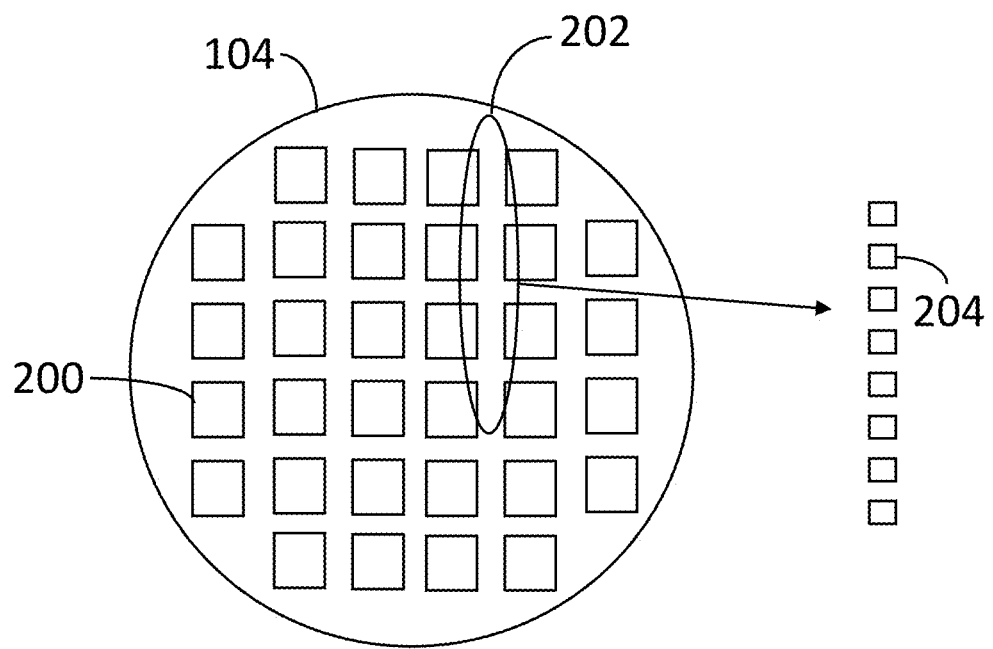
FIG. 2 illustrates a prior art semiconductor wafer with a scribe line hosting test circuits.
Figure 3:
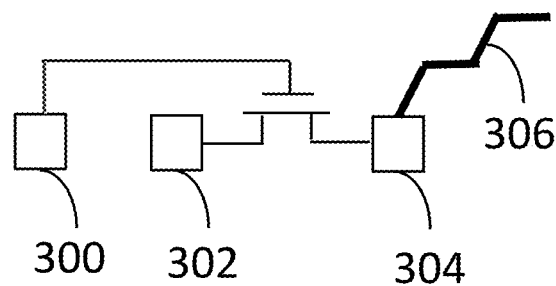
FIG. 3 illustrates a prior art test circuit and associated probe card needle.
Figure 4:
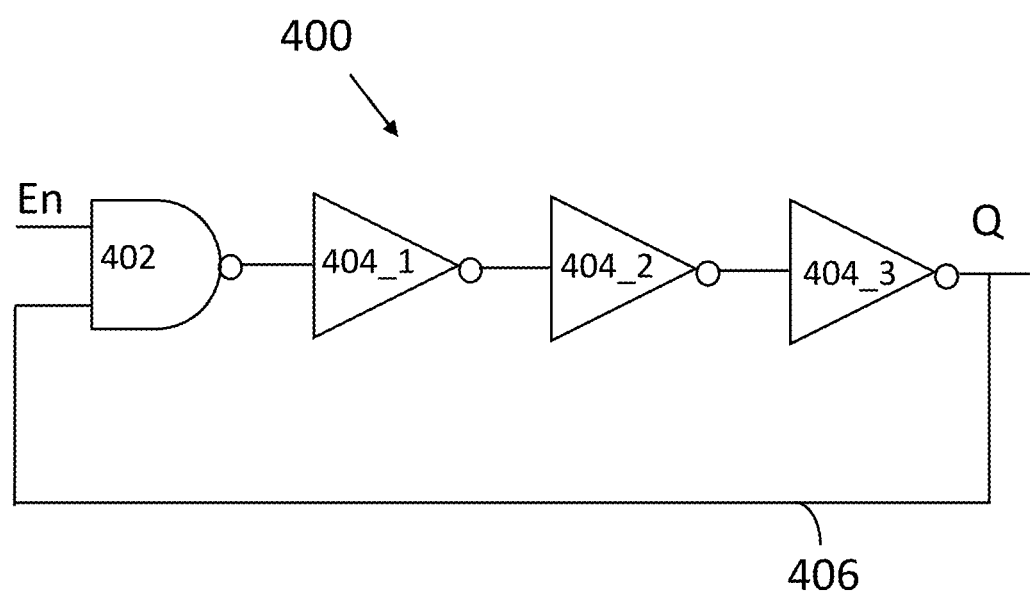
FIG. 4 illustrates a prior art ring oscillator.
Figure 5:
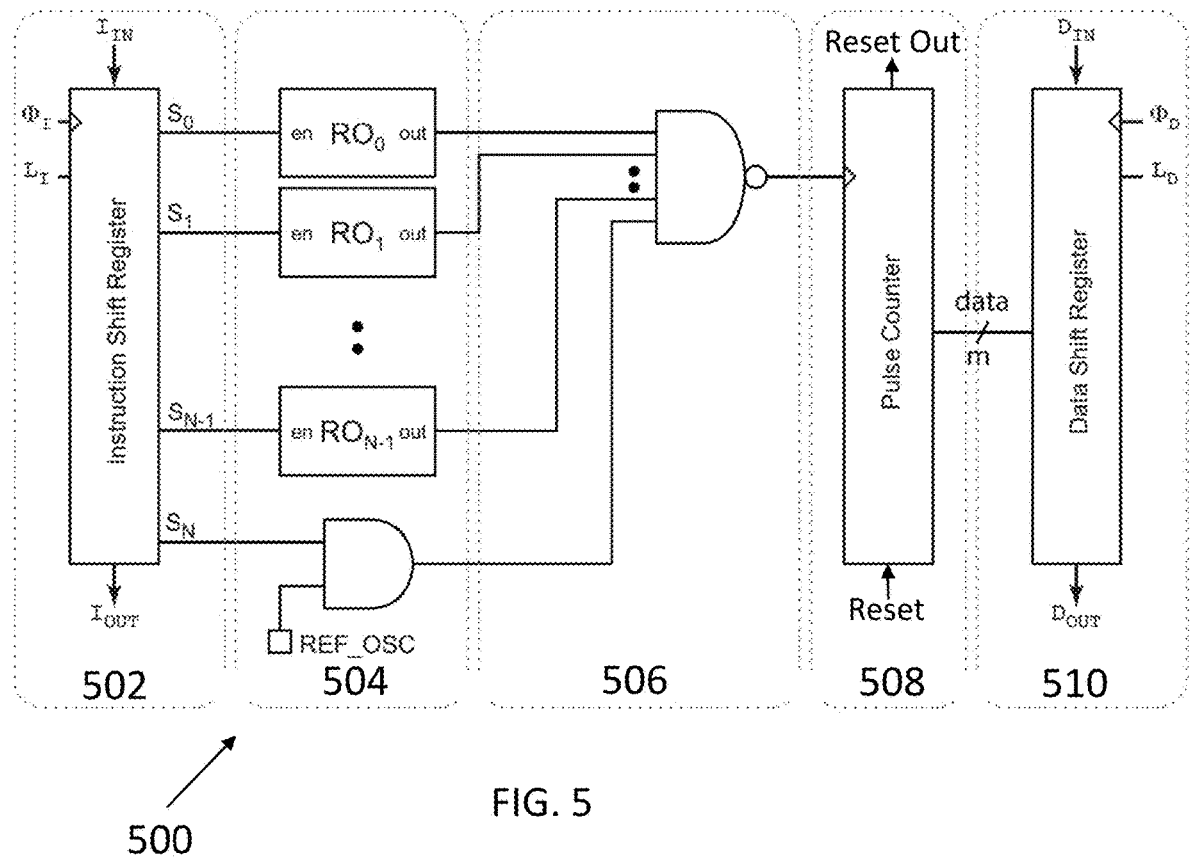
FIG. 5 illustrates a ring oscillator strand configured in accordance with an embodiment of the invention.

FIG. 5 illustrates a base architecture for what is referred to herein as a strand. Both asynchronous and synchronous embodiments of the invention have the same functional blocks forming the strand 500.

Block 502 is the instruction register that serves to configure the system for test by selecting the ring oscillator (RO) or input of interest via SA, where A is the address of the test block and N is the total number selectable choices for SN total possible selectable choices.

Block 504 is the bank of ROs. The bank of ROs may contain other reference inputs, such as a reference oscillator (REF_OSC) that are selected via the select line, S.

Block 506 is a multiplexer (or MUX) that combines the output signal from each RO into a single output. Since only one RO is enabled and oscillating at a time, that is the only oscillation that appears on the output line (right side) of Block 506, which is then presented to Block 508.

Block 508 is a Pulse Counter (or Frequency Counter). This block counts the number of oscillations that occur within a fixed period of time, called the integration window. Thus, this count is proportional to the frequency (or speed of the enabled RO).

Block 510 is a Data Shift Register that manages the flow of the measurement data to a computer that is located off-chip, such as test equipment 100.

Figure 6:
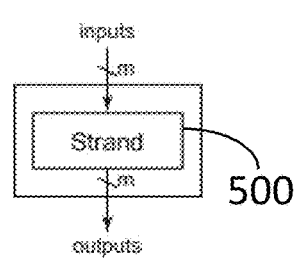
FIG. 6 is a simplified characterization of a strand.
Figure 7:
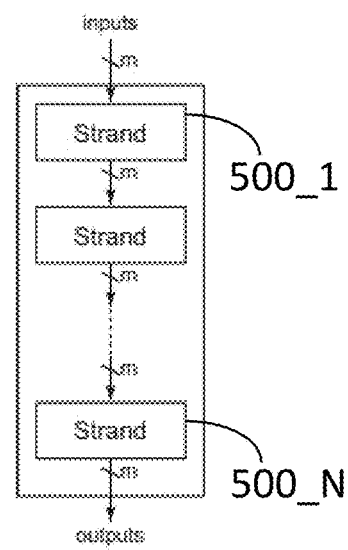
FIG. 7 illustrates a hierarchy of strands configured in accordance with an embodiment of the invention.

FIG. 6 is a simplified characterization of the strand 500 with m inputs and m outputs. FIG. 7 illustrates a hierarchy of strands 500_1 through 500_N. The chain of strands in FIG. 7 is possible because the inputs and outputs, of width m, of a strand can be connected when strands are tiled together through Physical Design (PD), as well as logically. In the case where there are multiple strands concatenated to make a strand chain, the chain has similar operation as a single strand, but allows concurrent operation and measurement. The operation is similar except that an RO in each of the strands can be measured simultaneously. The functional behavioral change to the Instruction Register initialization step is to shift in a logical "1" into the first RO location in each strand. The rest of the operations are the same as a single strand because the RO in each strand gets selected, runs, measured, but this happens in the chain in parallel. The data is then shifted out serially for all selected test structures.

Figure 8:
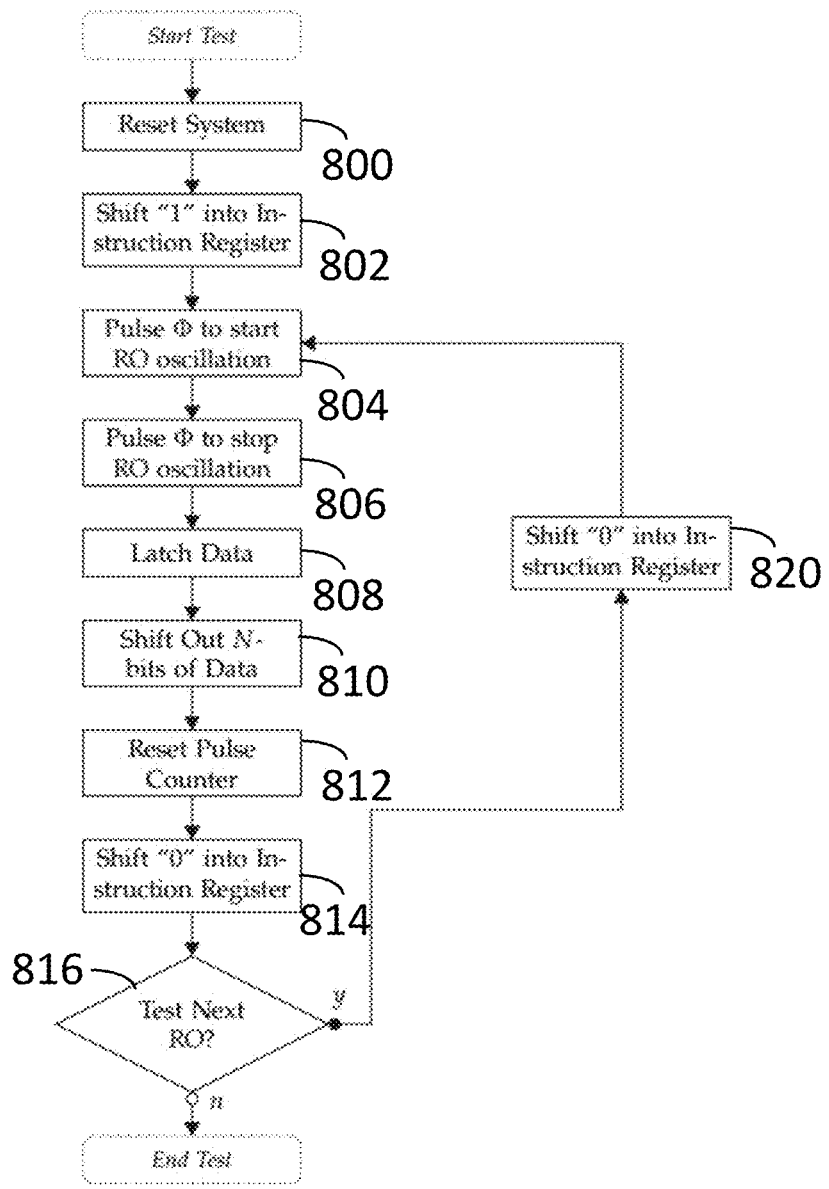
FIG. 8 illustrates processing operations associated with a strand configured in accordance with an embodiment of the invention.

FIG. 8 illustrates standard RO data acquisition operations. Initially the system is reset 800. A digital "1" is then shifted into the first bit of the instruction register of block 502 to select the first RO 802. A pulse signal Φ is applied to the instruction shift register of block 502 to start oscillations on the selected RO 804. The same signal is toggled to stop the RO oscillation 806. The data is latched 808. For example, data from the pulse counter of block 508 is latched to the shift register of block 510. N-bits of data are then shifted out 810 to form the DOUT signal of block 510. The pulse counter of block 508 is then reset 812. A zero is shifted into the instruction register 814 of block 502. It is then determined whether to test another RO 816. If so (816—Yes), a digital 0 is shifted into the shift register 820. This causes the next RO to be addressed because the initial digital 1 propagates. Blocks 804-816 are repeated until testing is completed (816—No).

Figure 9:
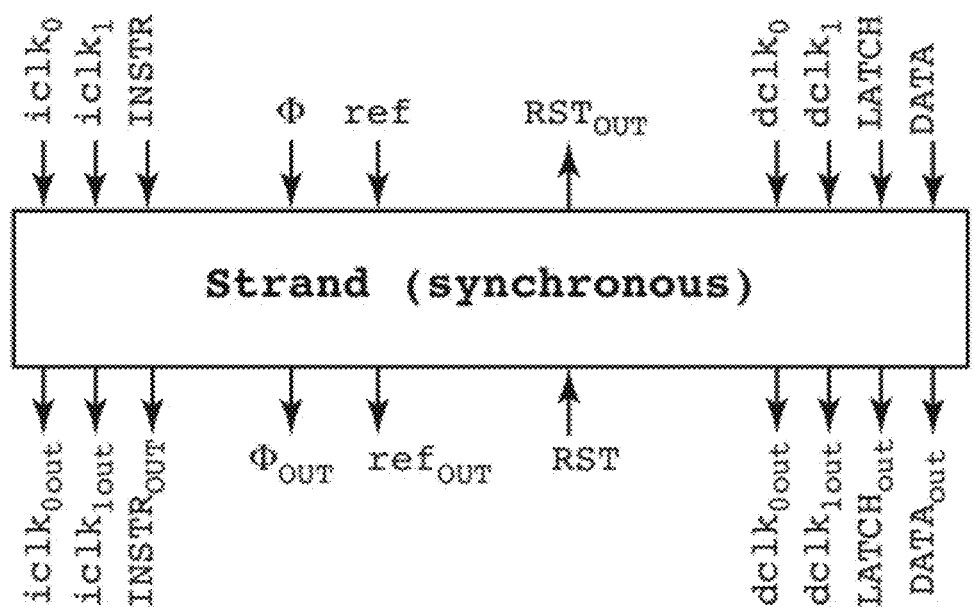
FIG. 9 illustrates signals associated with an embodiment of a synchronous strand.

FIG. 9 illustrates signals associated with an embodiment of a synchronous strand.

The synchronous strand is a self-contained block for selecting, running, and measuring the frequencies of an arbitrary number of ROs. As shown in FIG. 5, the synchronous strand 500 comprises an Instruction Register in block 502, a bank of test structures RO0 through RON−1 in block 504, counter in block 508, and a Data Register in block 510. One RO is measured at a time and data control integrity is achieved through non-overlapping clocks. The non-overlapping clocks in the shift registers increase robustness to process variation. Scalability is achieved through a serial interface that allows one or many devices to be tiled. This approach also includes methods to ensure data sanity and validity, such as scan integrity on Instruction Register and Data Register and a Reference Oscillator that is used to test and verify the counter circuits at speed and the select circuitry.

Figure 10:
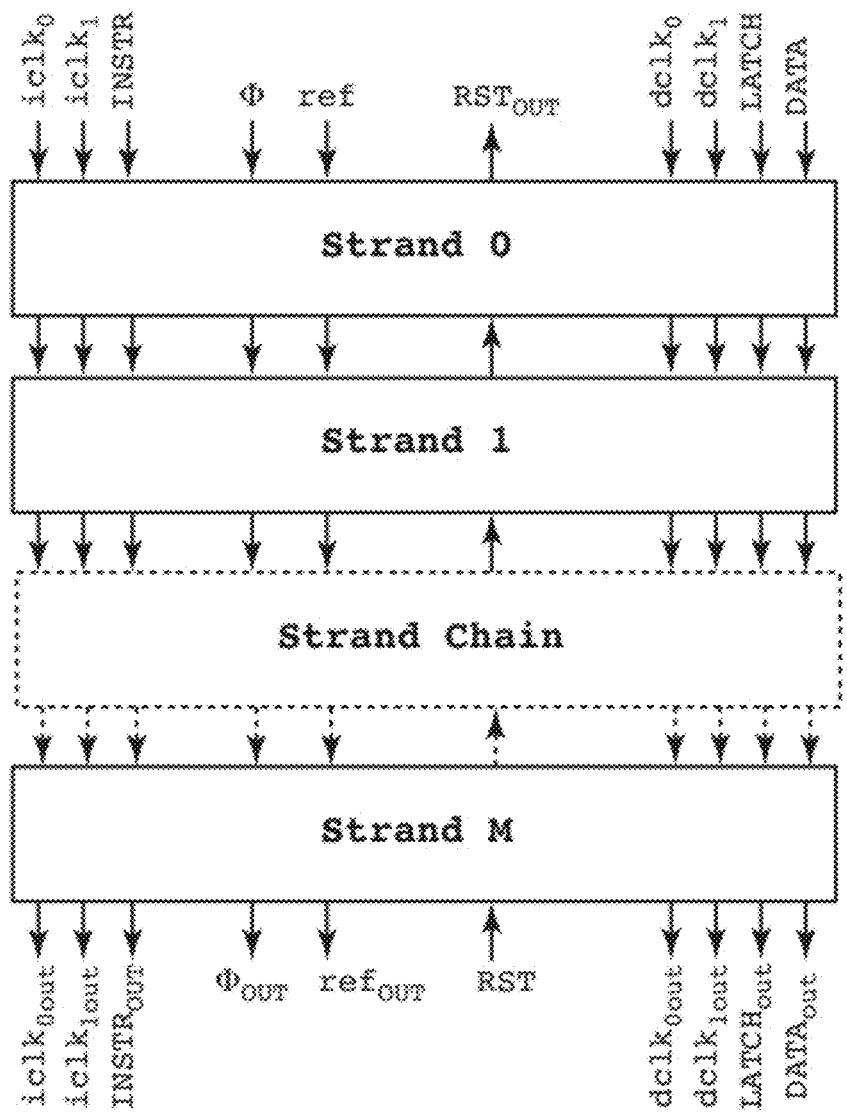
FIG. 10 illustrates a synchronous strand chain configured in accordance with an embodiment of the invention.

FIG. 10 illustrates a chain of synchronous strands. A chain or a single strand are fully functioning complexes for selecting and measuring ROs and either is appropriate for a top-level design and therefore, an arbitrary number of homogenous or heterogenous strands can be connected together to form a chain. If M Strands are connected together, the resulting chain can measure M ROs simultaneously. From perspective of the physical interface, the strand and chain have the same input and output signals, which allows for tiling.

The benefit of this architecture is the physical implementation can be placed as tiles and the architecture scales linearly with the number of ROs.

Figure 11:
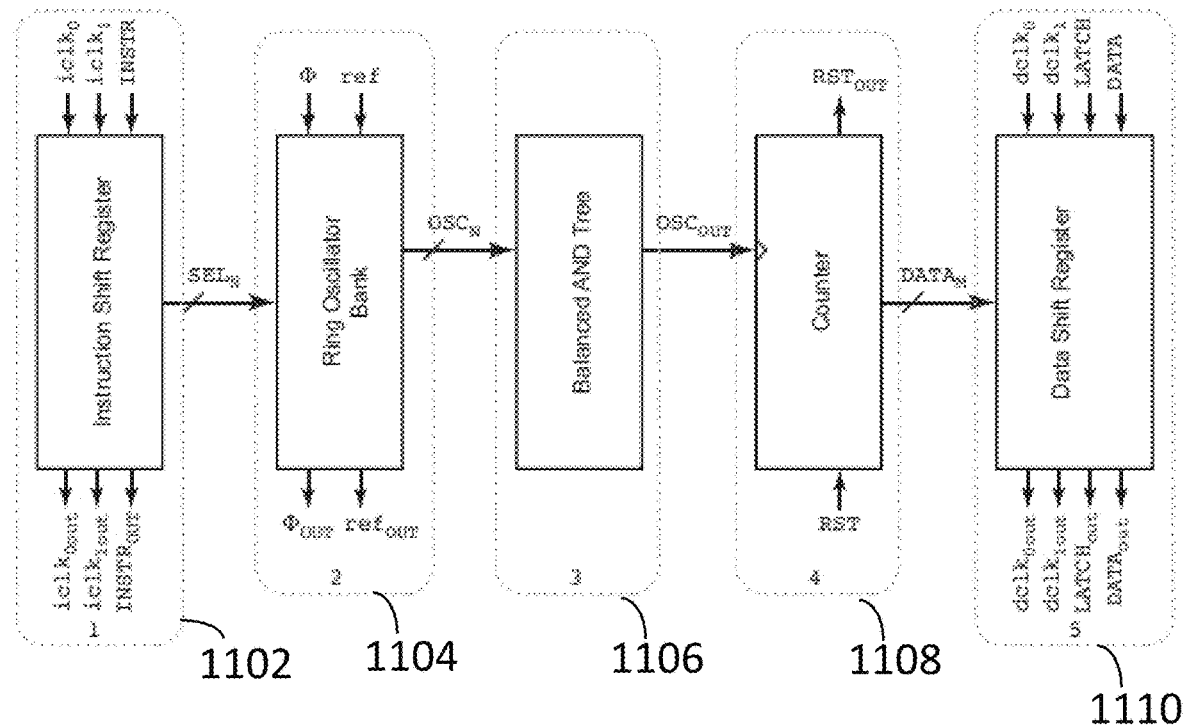
FIG. 11 illustrates a synchronous strand configured in accordance with an embodiment of the invention.

FIG. 11 maps the signals of FIGS. 9 and 10 to different strand blocks of a strand.

The instruction register block 1102 is a clocked FIFO implementing a 1 to N deserializer. Instruction register block shift register uses non-overlapping clocks, $iclk_0$ and $iclk_1$. INSTR is a 1-bit, serial data input, and $INSTR_{out}$ is 1-bit serial data output. The SEL bus is an output of N-bit width that represents the total number of ROs and test structures, which is the equivalent depth of the FIFO.

The RO Bank block 1104 contains ROs and possibly other test and verification structures. The SEL bus is an input of N-bit width that represents the total number of ROs and test structures, which is the equivalent depth of the FIFO. The signal Φ is a rising edge triggered event that alternates control between starting an RO oscillating and stopping it to create an integration time window. ref is an input signal from an optional external reference oscillator. The OSC signal is the selected ROs output, whether it is from an explicit RO or the reference oscillator signal. $\Phi_{out}$ and $ref_{out}$ are buffered outputs of $\Phi$ and ref respectively.

The Balanced AND (BAND) Tree block 1106 is a passive MUX for propagating the selected OSCi signal to OSCOUT for input into the COUNTER block 508. This structure is logically just an AND; however, the optimal architecture is with a BAND structure or ideally a Balanced Input Tree (BIT) structure.

The Counter block 1108 is an asynchronous counter designed from DIV2 cells. This counter is a (M−1)-bit counter that increments every time OSC pulses where bit M is the last data bit and is a sticky bit M for overflow detection. The DONE signal indicates that the counter has finished counting. The RST signal is an event that is returned from the data register signifying that the data has been captured and telling the counter to reset.

The Data Shift Register block 1110 takes DATAM signals from the Counter block 508 and creates a means to shift the data out through a shift register. The Data Shift Register has non-overlapping clocks: dclk0 and dclk1. This block is a synchronous FIFO implementing an M to 1 serializer. DATA is the input data and DATAOUT is the output data that allows for this block to be chained.

Figure 12:
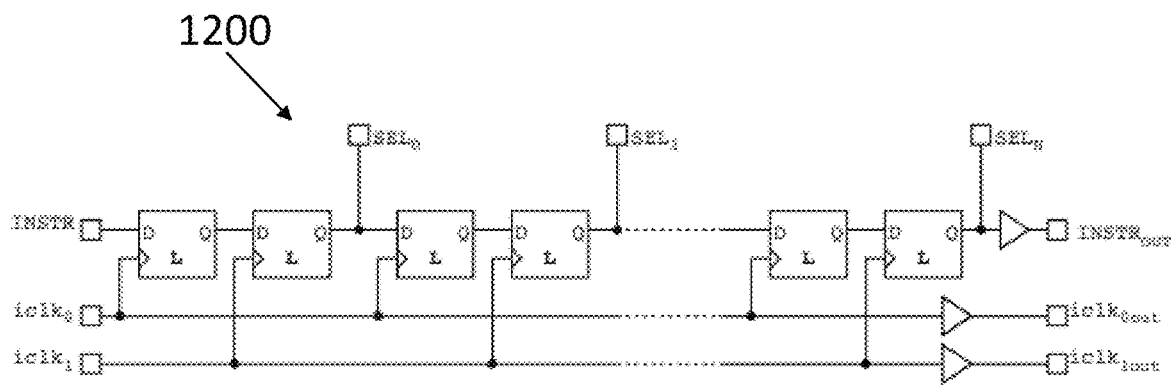
FIG. 12 illustrates a synchronous instruction register configured in accordance with an embodiment of the invention.

FIG. 12 illustrates a synchronous instruction register 1200. The purpose of the Instruction Register is to select the RO of interest by taking the serial stream and making it parallel, implementing a serial to parallel de-serializer. This register can be implemented with any choice of latch block, L. The total number of bits is N+1 bits for selecting between N ROs and the reference oscillator input.

Figure 13:
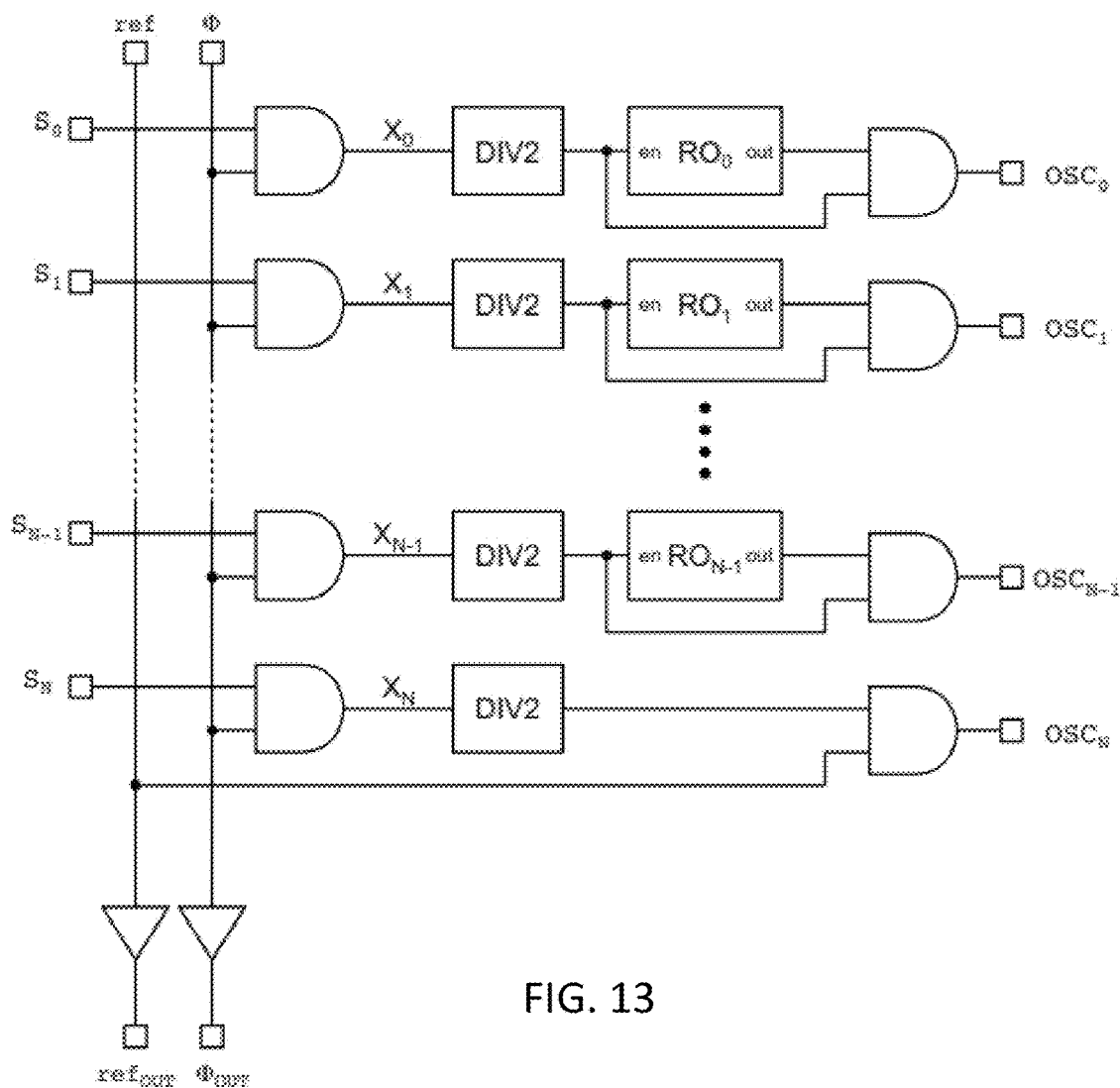
FIG. 13 illustrates a bank of synchronous ring oscillators configured in accordance with an embodiment of the invention.
Figure 14:
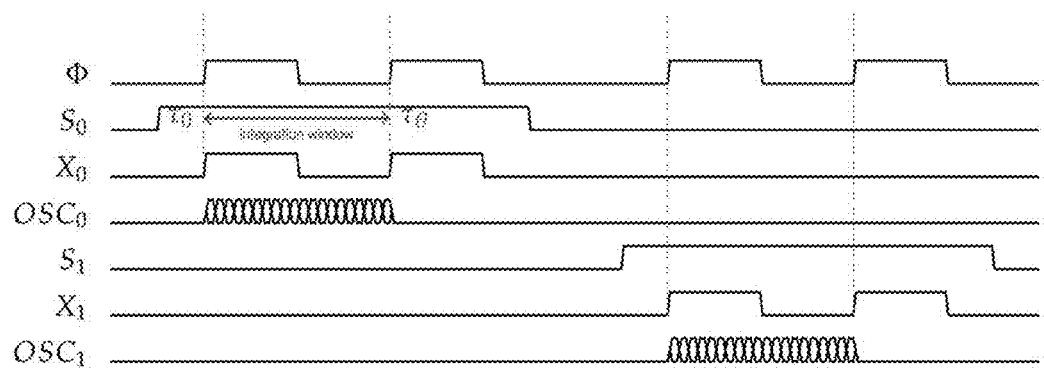
FIG. 14 illustrates waveforms associated with the circuit of FIG. 13.

FIG. 13 illustrates a synchronous RO bank in accordance with an embodiment of the invention. FIG. 14 is a signal timing example demonstrating the operation of the circuit of FIG. 13. The signal $\Phi$ is a rising edge triggered event that alternates control between starting a RO oscillation and stopping the RO oscillation to create an integration window over time, shown as the time between $\tau_0$ and $\tau_\theta$ in FIG. 14. The signal $\Phi$ causes a RO to pass an oscillating output to the OSC line based on the selection control line of $S_i$ for the structure of interest, i. Thus, $OSC_0$ is shown oscillating between $\tau_0$ and $\tau_\theta$ while $S_0$ is enabled and $OSC_1$ is shown oscillating during another cycle while $S_1$ is enabled. The rising edge of the signal $\Phi$ turns the oscillation on, and the following rising edge of $\Phi$ turns it off. This dual rising edge behavior ensures consistent oscillation time windows given uncertain on chip delays as this latency is present in the turn on and turn off rising edge signals and will therefore cancel out.

Figure 15:
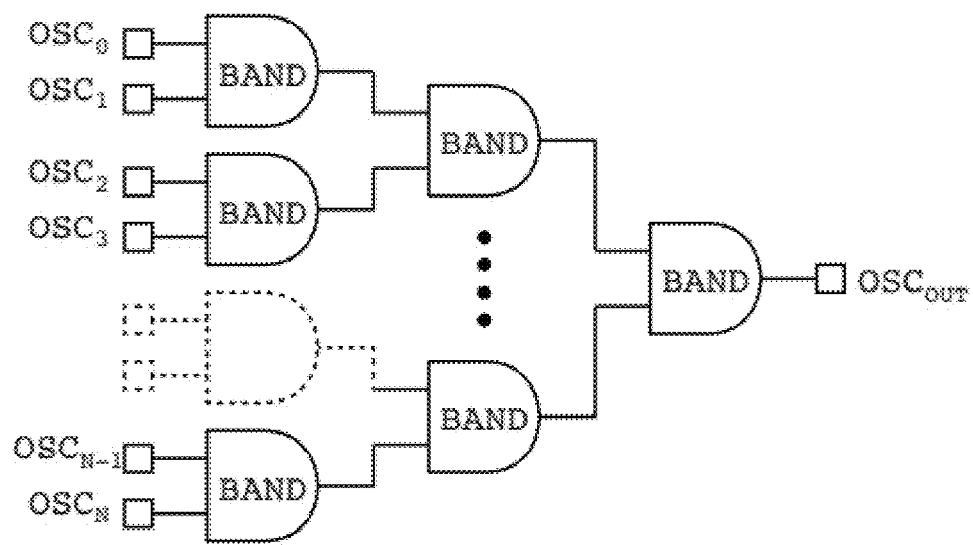
FIG. 15 illustrates a synchronous Balanced AND (BAND) tree multiplexer configured in accordance with an embodiment of the invention.

FIG. 15 illustrates a Balanced AND (BAND) tree that operates with matched rise and fall delays. As the number of ROs increases, the oscillator signal needs to pass through more BAND cells. If the rise and fall delays of the oscillating signal are unbalanced, the signal can become corrupted. The balance of the rise and fall delays in the BAND cell avoids this signal corruption.

This BAND tree MUX differs from the asynchronous implementation in that it does not contain an event signal path for monitoring propagation delays through the BAND tree.

Figure 17:
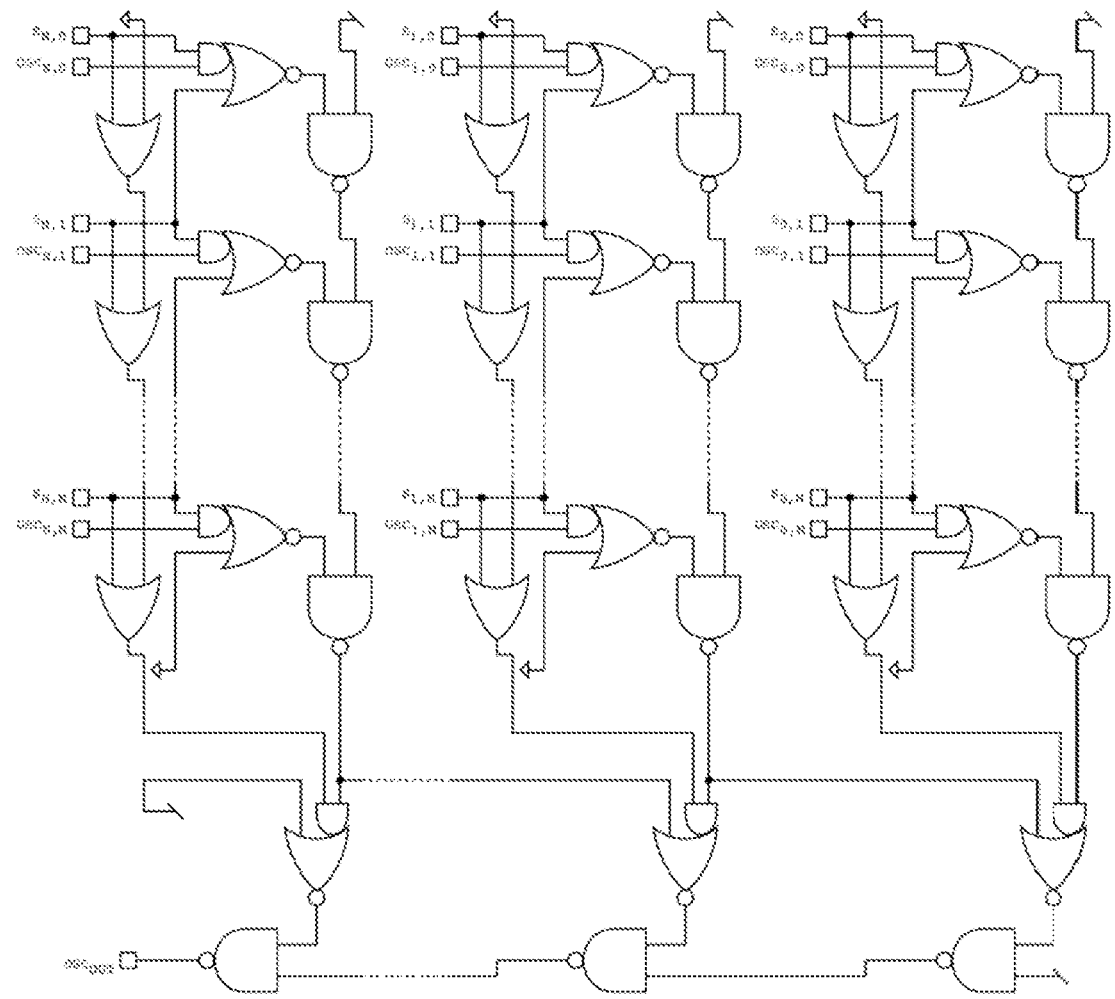
FIG. 17 illustrates a balanced input tree configured in accordance with an embodiment of the invention.

The Balanced Input Tree (BIT), in FIG. 17, can be used for the balanced AND tree, but the select line must also be passed. The balanced AND tree, when made from BAND blocks, requires the disabled ROs to have a logical "1" output, and the BIT structure does not require this behavior because the select line is also included.

Figure 16:
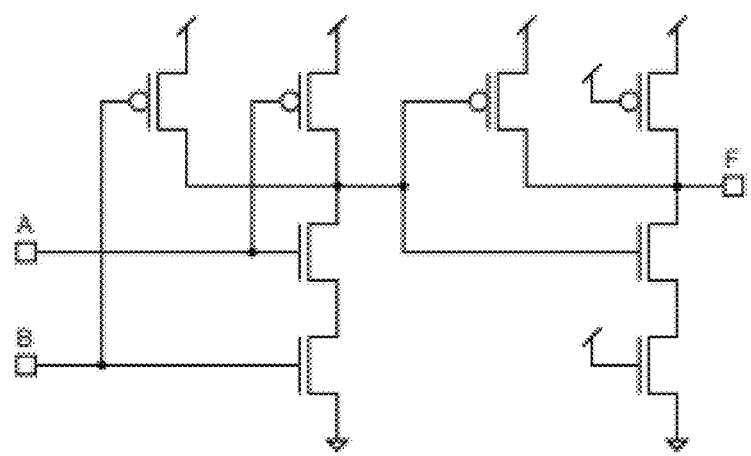
FIG. 16 illustrates a BAND cell configured in accordance with an embodiment of the invention.

FIG. 16 illustrates a balanced AND cell that may be used in accordance with an embodiment of the invention. Output F is the logical AND function of inputs A and B. Unlike a traditional AND cell, this circuit has symmetric rise and fall times.

The Balanced Input Tree (BIT) of FIG. 17 is an improved version of the BAND Tree of FIG. 15. The BAND structure balances any offset in the strength of the nMOS and pMOS transistors in the AND cell, but it does not balance any offsets in the wire interconnects. The BIT of FIG. 17 balances both wire-induced and transistor-induced offsets.

Figure 18:
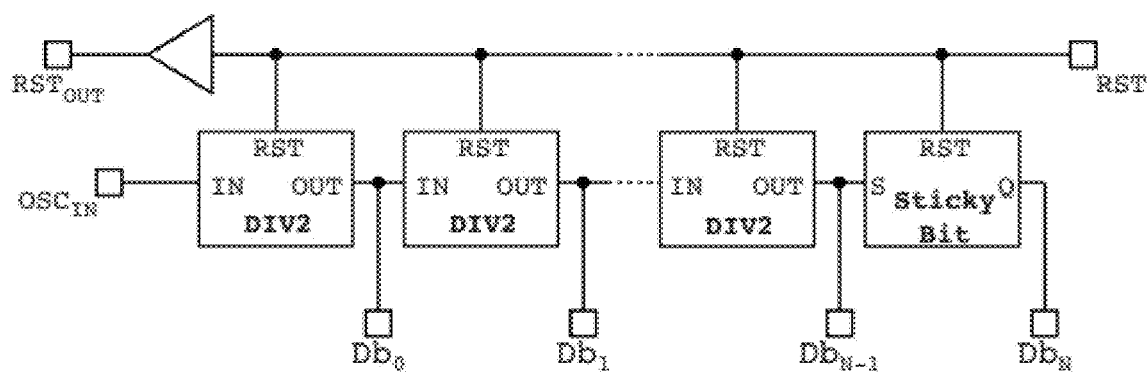
FIG. 18 illustrates a pulse counter configured in accordance with an embodiment of the invention.

FIG. 18 illustrates a pulse counter. The pulse counter is built from a ripple counter of "divide-by-2" (DIV2) cells with a sticky-bit cell to mark an overflow condition. In this counter there is no clock in the state machine so the counter is self-clocked. Every pulse on OSCIN increments the value of D[0:N−1] and the bit at D[N] implements overflow detection.

Figure 19:
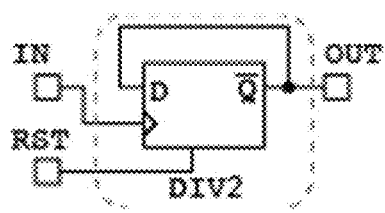
FIG. 19 illustrates a divide by two circuit utilized in accordance with an embodiment of the invention.
Figure 20:
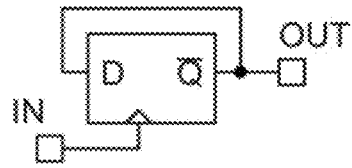
FIG. 20 illustrates another divide by two circuit utilized in accordance with an embodiment of the invention.

FIGS. 19 and 20 show two possible implementations of divide-by-2 circuits.

These circuits implement a divide-by-2 through a D-Flip-Flop. The OUT toggles every other time IN toggles, and thereby the OUT frequency is exactly half of the IN frequency.

Figure 21:
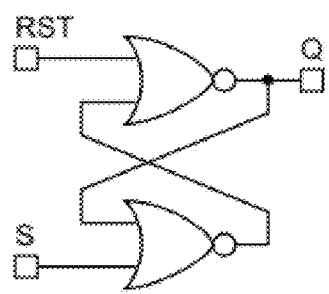
FIG. 21 illustrates a sticky bit circuit utilized in accordance with an embodiment of the invention.

FIG. 21 illustrates a possible implementation of the sticky bit module of FIG. 18.

This module keeps state until reset via the RST signal. The features of this circuit are that when S goes high, Q stays high at a logic "1", until reset by the RST signal, which clears the state. Upon reset, the Q signal returns to a low state at a logic "0".

Figure 22:
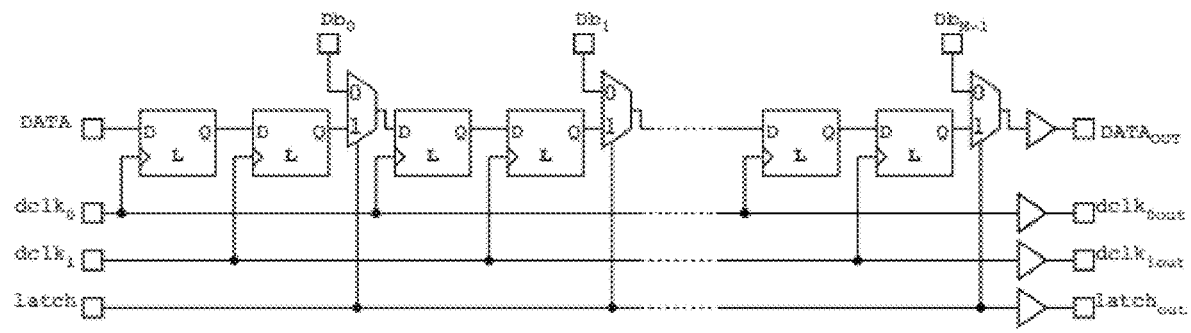
FIG. 22 illustrates a synchronous data register utilized in accordance with an embodiment of the invention.

FIG. 22 illustrates a synchronous data register that implements a serializer that takes parallel counter data and forms a serial bit stream. The register is constructed from transparent latches, L, with two back-to-back latches with alternating and non-overlapping clocks $dclk_0$ and $dclk_1$ to form a Flip Flop. The Flip Flop chain is M bits long to form a shift register that is the width of the asynchronous counter data. Each bit of the shift register also contains a MUX to switch the shift register from sample mode to shift mode where the data from the counter is loaded into the shift register.

Figure 23:
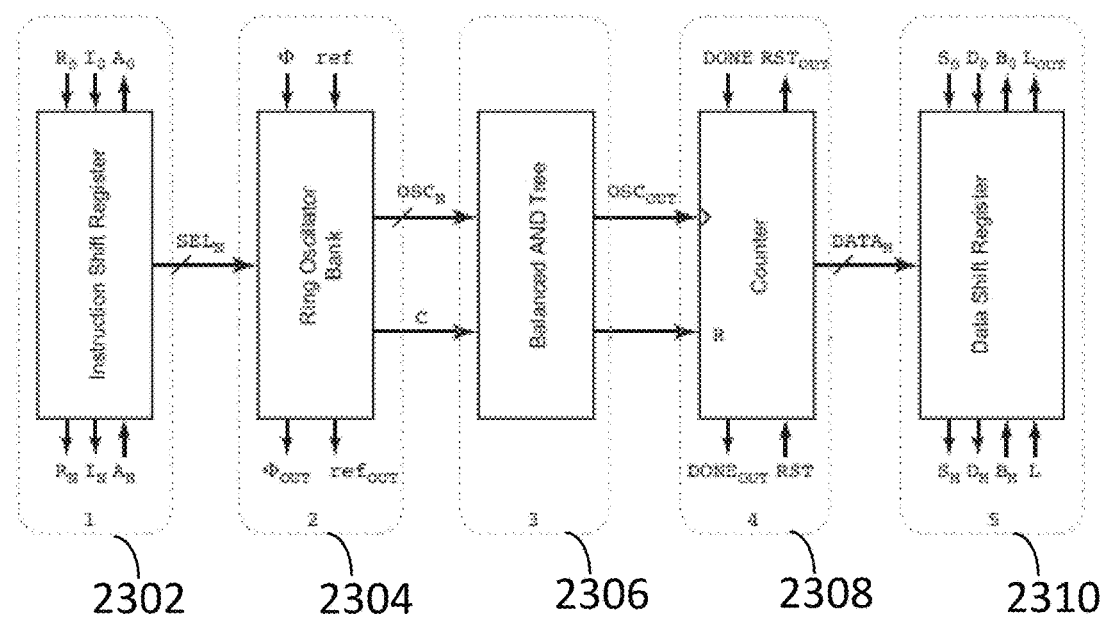
FIG. 23 illustrates an asynchronous strand configured in accordance with an embodiment of the invention.

FIG. 23 illustrates an embodiment of an asynchronous strand. The asynchronous strand is a self-contained block for selecting, running, and measuring the frequencies of an arbitrary number of ROs. It comprises of an instruction register block 2302, a bank of test structures block 2304, an AND tree block 2306, a counter block 2308, and a data register block 2310. The advantage of an asynchronous implementation is that one or more ROs are measured simultaneously. Asynchronous control circuitry increases reliability and decreases test time especially under extreme process and voltage variation. Scalability is achieved through a serial interface that allows one or many devices to be tiled. This approach also includes methods to ensure data correctness, such as scan integrity on instruction register and data register and a reference oscillator that is used to test and verify the counter circuits at speed and select circuitry.

The instruction register block 2304 is an asynchronous First In First Out (FIFO) implementing a 1 to N de-serializer. For the input boundary, $R_0$, $I_0$, $A_0$ are respectively an input request signal, an input data signal, and an input acknowledge signal. For the output boundary, $R_N$, $I_N$, $A_N$ are respectively an output request signal, an output data signal, and an input acknowledge signal. The SEL bus is an output of N-bit width that represents the total number of ROs and test structures, which is the equivalent depth of the FIFO.

The RO Bank block 2304 contains ROs and possibly other test and verification structures. The SEL bus is an input of N-bit width that represents the total number of ROs and test structures, which is the equivalent depth of the FIFO. The signal $\Phi$ is a rising edge triggered event that alternates control between starting an RO oscillating and stopping it to create an integration time window. ref is an input signal from an external reference oscillator. The OSC signal is the selected ROs output, whether it is from an explicit RO or the reference oscillator signal. $\Phi_{out}$ and $\text{ref}_{out}$ are buffered outputs of $\Phi$ and ref, respectively. C is an event timing signal that mirrors the oscillation time period and is shifted in delay such that it will eventually be used to signal to the counter that no more pulses are coming from the selected RO.

The AND tree block 2306 is a passive Multiplexor (MUX) for propagating the selected $OSC_i$ signal to $OSC_{OUT}$ for input into the COUNTER block 2308. This structure is a logical AND; however, the optimal architecture is with a BAND or ideally a BIT. This block also contains an event signal path to capture the worst-case delay of the AND tree, which is passed to the Counter block as R.

The Counter block 2308 is an asynchronous counter. This counter is a (M−1)-bit counter that increments every time OSC pulses where bit M is the last data bit and is a sticky bit M for overflow detection. R is an input event signal whose delay is longer than the OSC path. The DONE signal indicates that the counter has finished counting. The RST signal is an event that is returned from the data register signifying that the data has been captured and telling the counter to reset.

The Data Shift Register block 2310 takes $DATA_M$ signals from the counter block 2308 and creates a means to shift the data out through an asynchronous shift register. This block is an asynchronous FIFO implementing an M to 1 serializer. For the input boundary, $S_0$, $D_0$, $B_0$ are respectively an input request signal, an input data signal, and an input acknowledge signal. For the output boundary, $S_M$, $D_M$, $B_M$ are respectively an output request signal, an output data signal, and an input acknowledge signal.

Figure 24:
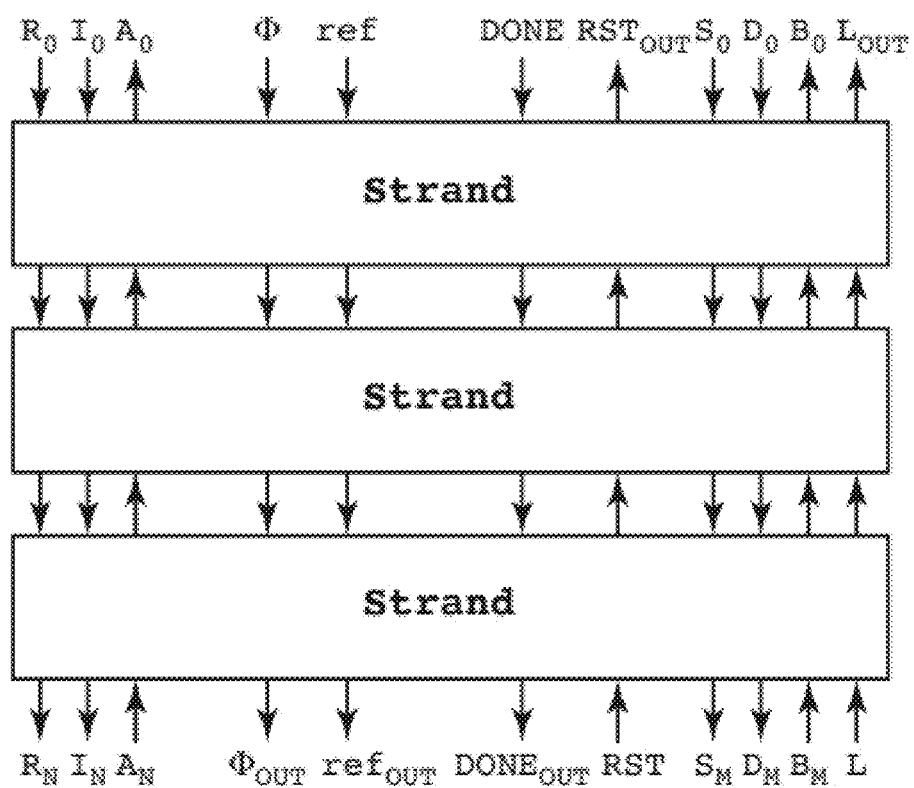
FIG. 24 illustrates an asynchronous chain utilized in accordance with an embodiment of the invention.
Figure 25:
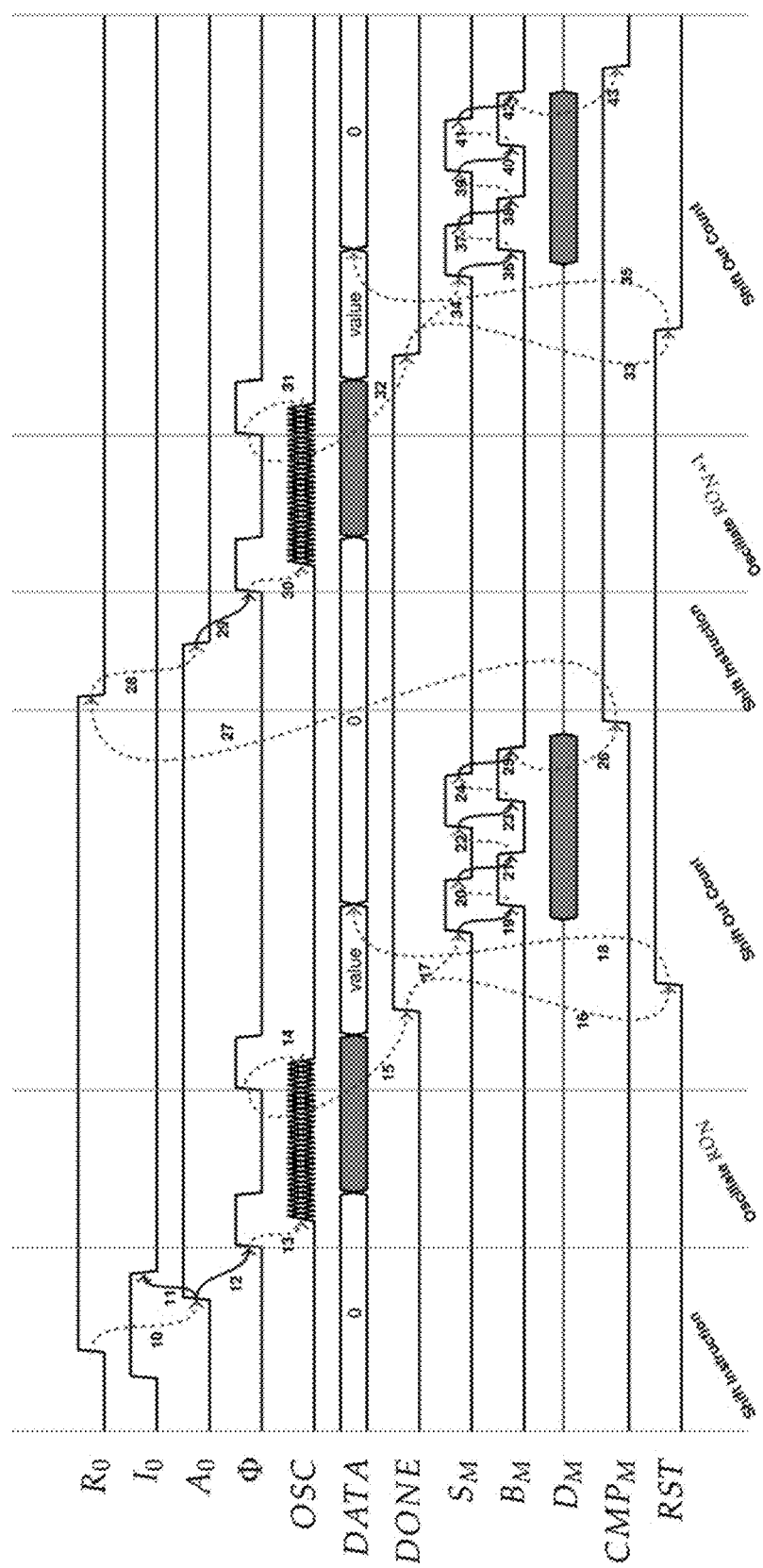
FIG. 25 is an asynchronous chain timing diagram characterizing the operation of an embodiment of the invention.

FIG. 24 illustrates a chain of asynchronous strands. FIG. 25 illustrates the signal timing associated with the circuit of FIG. 24. A chain and a single strand are fully functioning blocks for selecting and measuring ROs. Either is appropriate for a top level design and therefore, an arbitrary number of homogenous or heterogenous strands can be connected together to form a chain. If M Strands are connected together, the resulting chain can measure M ROs simultaneously. From the perspective of the physical interface, the strand and chain have the same input and output signals, which allows for tiling.

FIG. 25 is an example of asynchronous timing for four bits. Lines 11, 12, 19, 21, 23, 25, 29, 36, 38, 40 and 42 are externally controlled signals, and lines 10, 13, 14, 15, 16, 18, 20, 22, 24, 26, 28, 30, 31, 32, 33, 34, 35, 37, 39, 41 and 43 are internally generated control signals. The circuits are driven by edge triggered events. The timing diagram is referenced from the boundaries, so the address of "1" on $I_0$ is explicit for the initial shift, but is internal for the next shift, so that a logical "0" should be presented on $I_0$ for every RO after the first one. A flowchart for the test behavior is presented in FIG. 26. The test is conducted by shifting a single logical "1" into the instruction register to select the first RO. The signal $\Phi$ is then toggled, and then toggled again. The difference in time between the rising edges of $\Phi$ is the integration window. DONE is an event signal guaranteed to be slower than the counter's settling time to indicate that data is ready to be latched into the data register. After DONE is asserted, an event on $S_M$ is asserted to present a data bit on the $D_M$ line and $B_M$ shows that the data on $D_M$ is valid. The cycling of $S_M$ and $B_M$ is continued until all data is read via $D_M$. The instruction register is then clocked to select the next RO.

Figure 26:
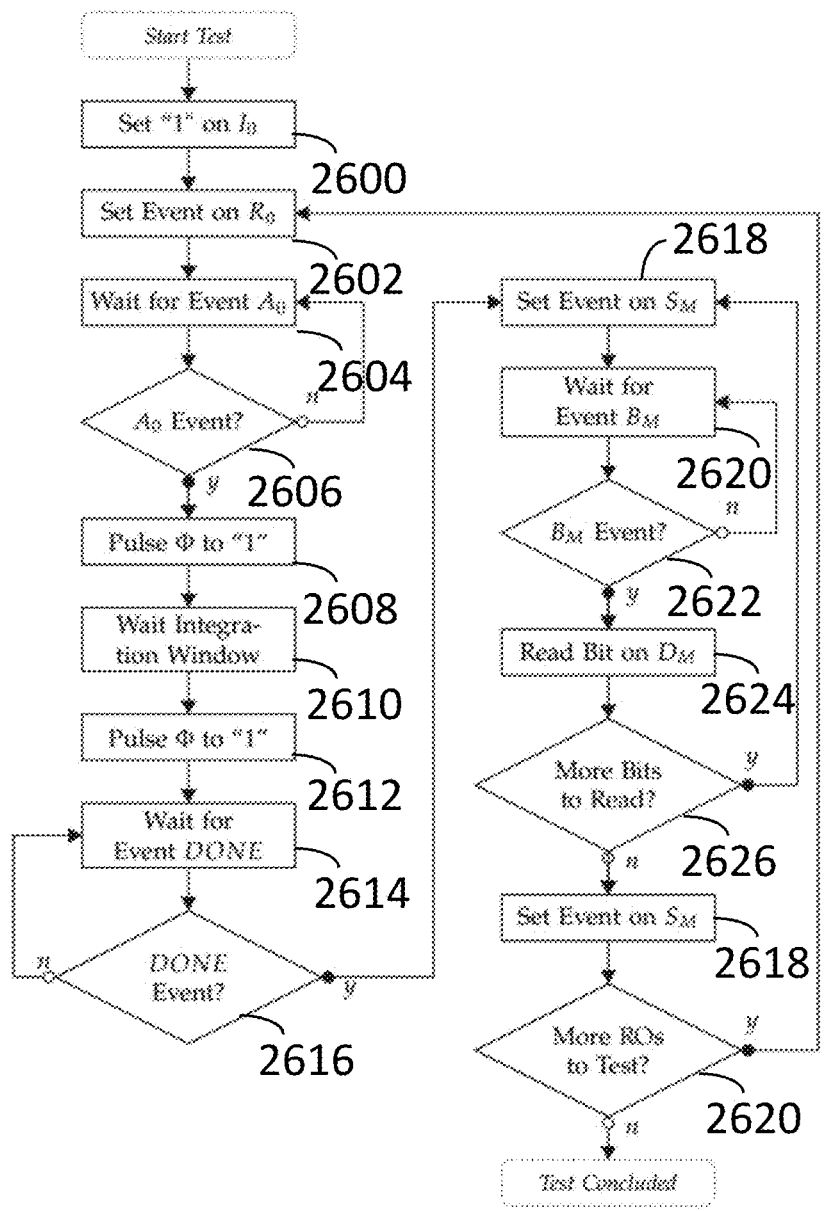
FIG. 26 illustrates asynchronous processing operations utilized in accordance with an embodiment of the invention.

FIG. 26 illustrates processing operations associated with an asynchronous chain configured in accordance with an embodiment of the invention. Initially $I_0$ is set to a digital "1" 2600. An event is then set on $R_0$ on the instruction register 2602. An acknowledgement signal of $A_0$ from the instruction register is waited for 2604. Decision block 2606 loops back to block 2604 until the signal is received. Afterwards $\Phi$ is pulsed to a digital "1" 2608. The integration window transpires 2610 until $\Phi$ is pulsed again 2612. There is then a wait for the event DONE signal 2614. Decision block 2616 loops back to block 2614 until the signal is received. Thereafter, an event is set on $S_M$ 2618. Blocks 2620 and 2622 operate as a loop until the $B_M$ even is received. Bits are then read on $D_M$ 2624. When all bits are read, an event is set on $S_M$. If additional ROs need to be tested (2620—Yes), control returns to block 2602.

Figure 27:
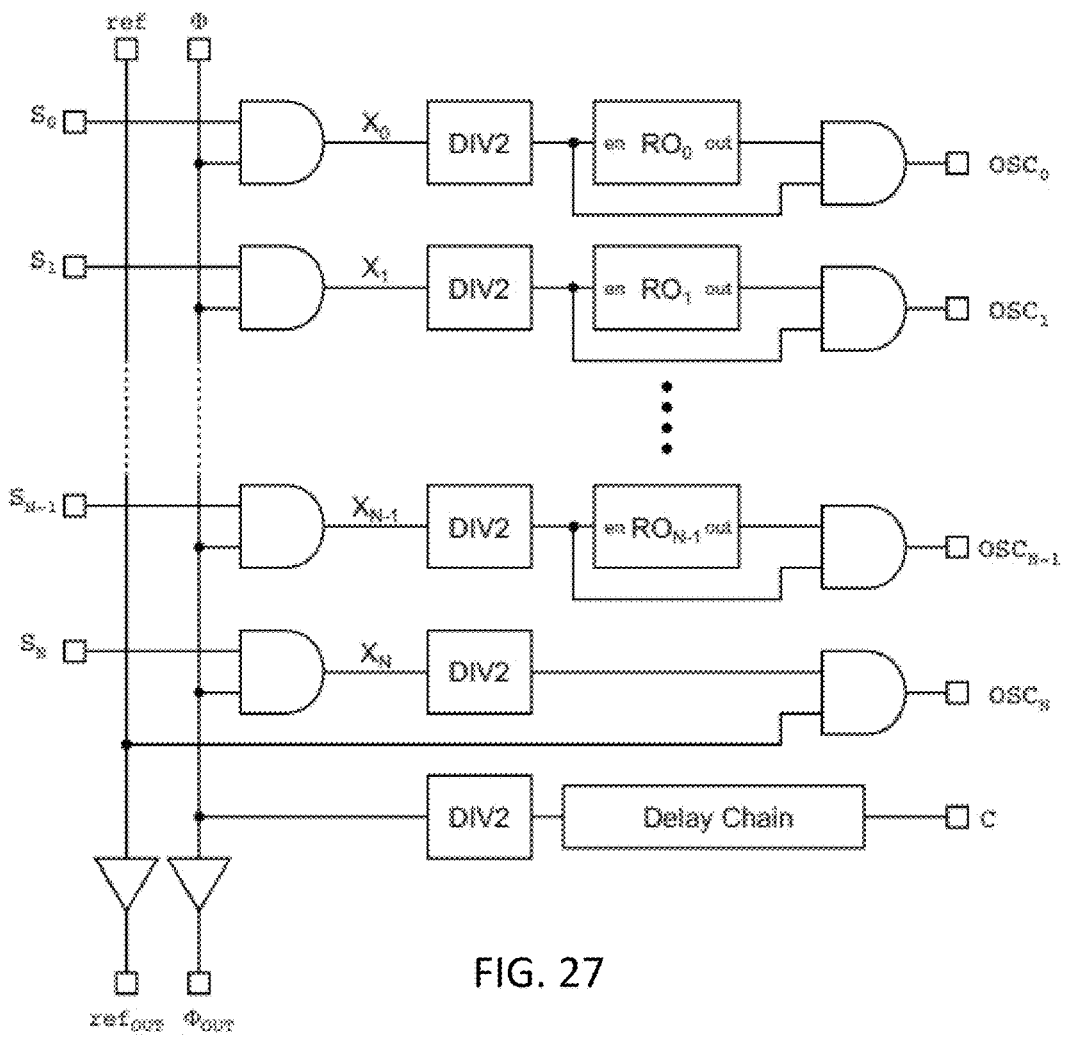
FIG. 27 illustrates an asynchronous ring oscillator bank configured in accordance with an embodiment of the invention.
Figure 28:
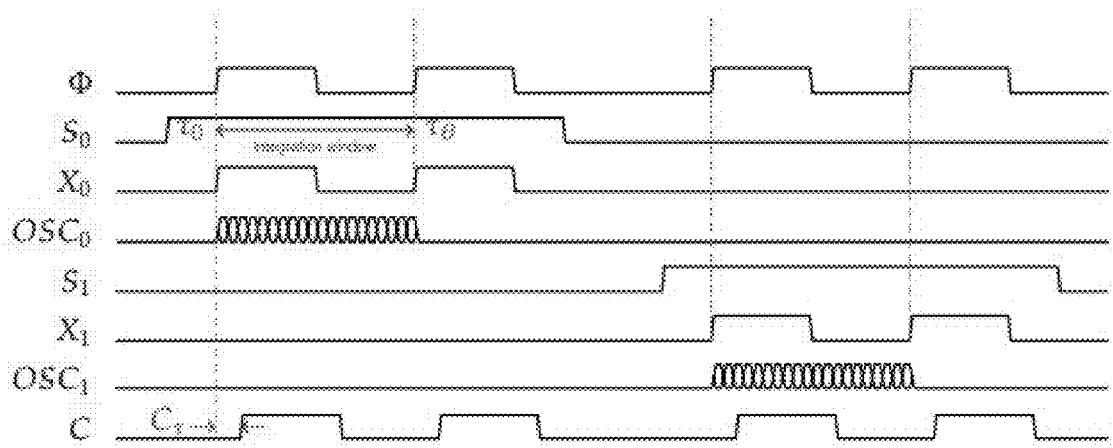
FIG. 28 is an asynchronous ring oscillator bank timing diagram.

FIG. 27 illustrates an asynchronous RO bank. FIG. 28 is a timing diagram for signals associated with the circuit of FIG. 27. The signal $\Phi$ is a rising edge triggered event that alternates control between starting an RO oscillating and stopping it in order to create an integration time window. The $\Phi$ signal causes an RO or the reference oscillator to pass an oscillating output to the OSC line based on the selection control line of $S_i$ for the structure of interest, i. The rising edge of the $\Phi$ signal enables the RO oscillation and the following rising edge of the $\Phi$ signal turns it off. This dual rising edge behavior ensures consistent oscillation time windows given uncertain on chip delays as this latency is present in the turn on and turn off rising edge signals and will therefore cancel out. The delay cell needs to be greater than the longest loop time of any RO to produce the signal C. This signal, C, is used to decide when the counter has settled. C could alternatively be generated by a delay from each OSC output.

FIG. 28 shows an integration time window between $\tau_0$ and $\tau_\Theta$. The $\Phi$ signal causes a RO to pass an oscillating output to the OSC line, as shown on $OSC_0$ and $OSC_1$. The delay signal, C, presents a delay of the signal, $\Phi$, through a delay-line. This delay is shown as $C_t$ in the timing diagram.

Figure 29:
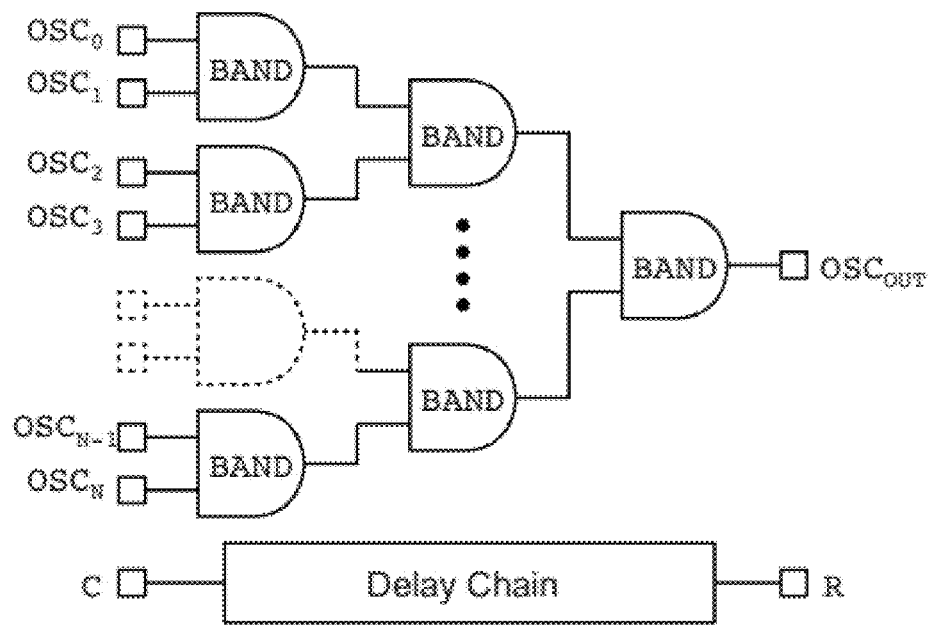
FIG. 29 illustrates an asynchronous AND tree configured in accordance with an embodiment of the invention.

FIG. 29 illustrates an asynchronous logical AND tree. The balanced AND tree serves to have matched delay paths between oscillators. This tree also requires a completion element. Features of this component are a delay element between C and R needs to be a longer delay than the worst case propagation delay from any OSC to OSCOUT. This entire structure is an N+1 input AND tree implemented as a distributed hierarchy of two-input BAND gates. This structure performs the function of passively multiplexing the RO outputs. Only the selected RO will be propagating an oscillating signal to one of the inputs of the AND tree, and this oscillation propagates to OSCOUT. The unselected ROs asserts a logic level high as to not block the selected RO's oscillation. The BIT can be used for the balanced AND tree, but the select line must be passed. The balanced AND tree, when made from BAND blocks, requires the disabled ROs to have a logical "1" output, and the BIT structure does not require this behavior because the select line is also included.

Figure 30:
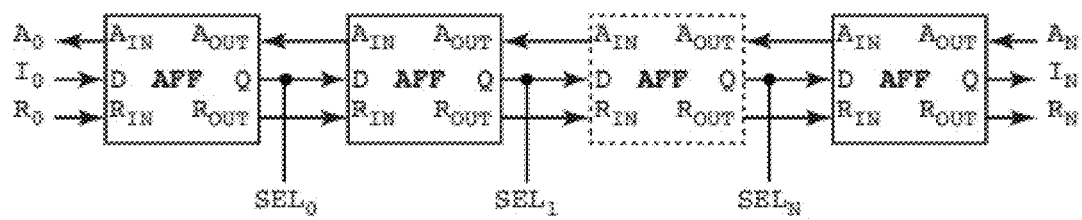
FIG. 30 illustrates an asynchronous instruction register utilized in accordance with an embodiment of the invention.

FIG. 30 illustrates an asynchronous instruction register. The asynchronous Instruction Register is constructed from Asynchronous Flip Flops (AFF). The purpose of the Instruction Register is to select the RO, or reference structure of interest by taking the serial stream and making it parallel, implementing a serial to parallel de-serializer. The AFF is the base component of the 1-bit of an asynchronous FIFO, and the data is bundled asynchronously by design using request, R, and acknowledge, A, signals as a method of handshaking. There are N+1 total bits for selecting between N ROs and the reference oscillator input.

Figure 31:
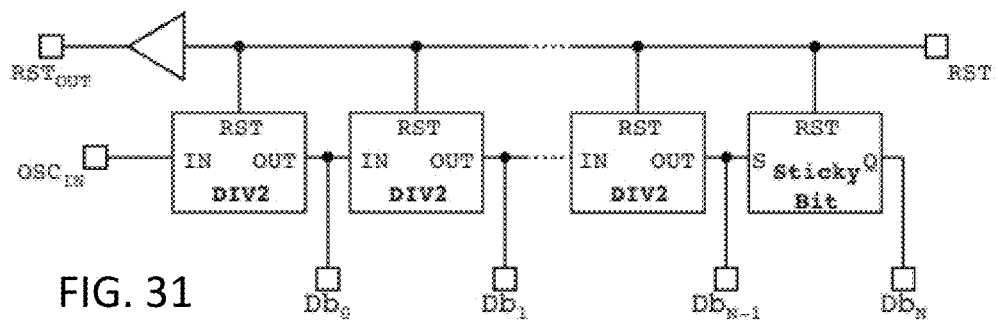
FIG. 31 is an asynchronous pulse counter configured in accordance with an embodiment of the invention.
Figure 32:
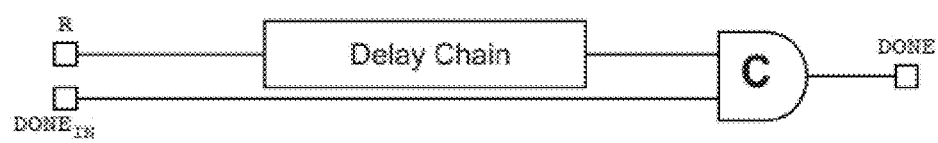
FIG. 32 is a delay chain utilized in accordance with an embodiment of the invention.

FIG. 31 illustrates an asynchronous pulse counter. The asynchronous counter is built from DIV2 cells with a sticky-bit cell to mark an overflow condition. Asynchronous refers to the fact that there is no clock in the state machine and that the counter is self-clocked. Every pulse on $OSC_{IN}$ increments the value of D[0:N−1] and the bit at D[N] implements overflow detection. The delay block of FIG. 32 performs the event signal generation for the overall bundled-data asynchronous control protocol that the asynchronous sensor array. $DONE_{IN}$ is used when multiple strands are connected together to form a chain. All counters should settle before shifting out data.

Figure 33:
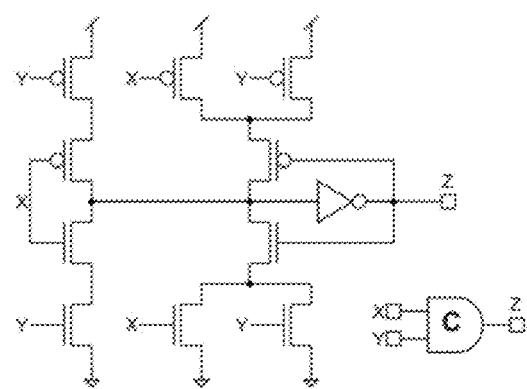
FIG. 33 is a Muller-C module circuit utilized in accordance with an embodiment of the invention.

FIG. 33 shows a Muller-C module, which is represented by the AND cell with a "C". This circuit is used to perform a specialized AND function on edge event signals as shown in the following logic truth table.

| X | Y | Z |
|---|---|---|
| 0 | 0 | 0 |
| 0 | 1 | Hold state |
| 1 | 0 | Hold state |
| 1 | 1 | 1 |

Unlike the traditional AND cell, the state is held when the inputs are different.

Figure 34:
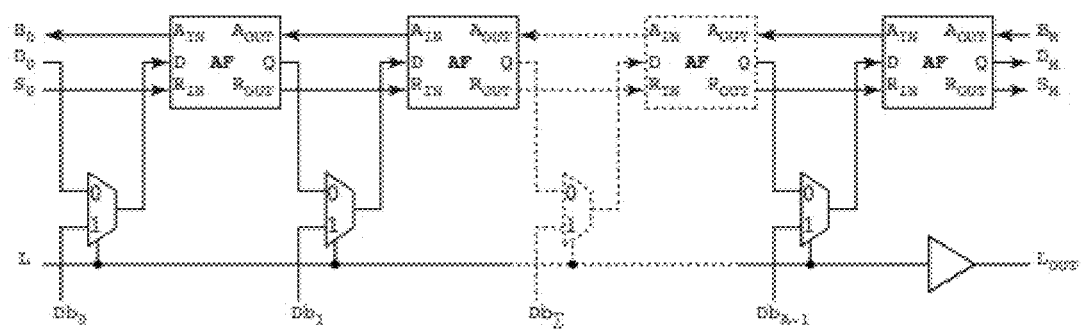
FIG. 34 is an asynchronous data register utilized in accordance with an embodiment of the invention.

FIG. 34 illustrates an asynchronous data register. The data register is constructed from Asynchronous Flip Flops AFF. The purpose of the data register is to load the data from the pulse counter and create a parallel to serial serializer. The AFF is the base component of the register with depth of M, that matches the width, M, of the pulse counter. The data is loaded from the counter using the MUX that is enabled by the load signal, L. The bit from the counter, i, corresponds to the bit that will be loaded via line $Db_i$. The data is bundled asynchronously by design for serial output using request, S, and acknowledge, B, signals as a method of handshaking.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
a collection of ring oscillators;
an instruction register block comprising an input line configured to input serialized data, and a plurality of output lines connected to respective ring oscillators and configured to output an address as a parallel output signal configured to activate one ring oscillator in the collection of ring oscillators;
a multiplexer comprising a plurality of input lines each connected to an output line of a respective ring oscillator in the collection of ring oscillators, the multiplexer being configured to connect any one of the ring oscillators to an output line of the multiplexer;
a pulse counter connected to the output line of the multiplexer and configured to count the number of oscillations of a selected ring oscillator within a predetermined time period to form a multiple bit frequency count output signal; and
a data shift register configured to receive the multiple bit frequency count output signal and produce a serial frequency count output signal.

2. The apparatus of claim 1 wherein the instruction register block implements a serial to parallel de-serializer responsive to a clock signal.

3. The apparatus of claim 1 wherein the collection of ring oscillators is responsive to a rising edge trigger signal that establishes each selected time period.

4. The apparatus of claim 1 wherein the multiplexer is a synchronous balanced logical AND tree.

5. The apparatus of claim 1 wherein the multiplexer is a balanced input tree.

6. The apparatus of claim 1 with a uniform set of input nodes and output nodes that form a ring oscillator strand.

7. The apparatus of claim 6 connected to a plurality of identically configured ring oscillator strands.

8. The apparatus of claim 6 wherein the input nodes include an instruction clock node, an instruction signal node, a rising edge trigger signal node, a reference signal node, a reset signal node, a data clock signal node, a latch signal node and a data signal node.

9. The apparatus of claim 6 wherein the output nodes include an instruction clock node, an instruction signal node, a rising edge trigger signal node, a reference signal node, a reset signal node, a data clock signal node, a latch signal node and a data signal node.

10. The apparatus of claim 6 wherein the input nodes include an input request signal node, an input data signal node, an input acknowledge signal node, an instruction signal node, a rising edge trigger signal node, a reference signal node, a done signal node, and a reset signal node.

11. The apparatus of claim 6 wherein the output nodes include an input request signal node, an input data signal node, an input acknowledge signal node, an instruction signal node, a rising edge trigger signal node, a reference signal node, a done signal node, and a reset signal node.

12. An apparatus, comprising:
a collection of ring oscillators;
an instruction register block configured to sequentially address and activate each ring oscillator in the collection of ring oscillators;
a multiplexer with input lines connected to each ring oscillator in the collection of ring oscillators and an output line;
a pulse counter connected to the output line of the multiplexer to count the number of oscillations of a selected ring oscillator within a selected time period to form a multiple bit frequency count output signal; and
a data shift register to receive the multiple bit frequency count output signal and produce a serial frequency count output signal, wherein the pulse counter comprises serially connected clocked divide-by-2 cells with a sticky-bit cell to identify an overflow condition.

13. The apparatus of claim 1 wherein the data shift register comprises serially connected latches responsive to alternate and non-overlapping clock signals.

14. The apparatus of claim 1 wherein the instruction register block implements a serial to parallel de-serializer responsive to an input request signal, an input data signal and an input acknowledge signal.

15. The apparatus of claim 1 wherein the data shift register is responsive to an input request signal, an input data signal and an input acknowledge signal.

16. The apparatus of claim 1 wherein the instruction register block implements a serial to parallel de-serializer utilizing asynchronous flip flops.

17. The apparatus of claim 12 with a uniform set of input nodes and output nodes that form a ring oscillator strand.

18. An apparatus, comprising:
  a collection of ring oscillators;
  an instruction register block configured to sequentially address and activate each ring oscillator in the collection of ring oscillators;
  a multiplexer with input lines connected to each ring oscillator in the collection of ring oscillators and an output line;
  a pulse counter connected to the output line of the multiplexer to count the number of oscillations of a selected ring oscillator within a selected time period to form a multiple bit frequency count output signal; and
  a data shift register to receive the multiple bit frequency count output signal and produce a serial frequency count output signal, wherein the pulse counter comprises serially connected self-clocked divide-by-2 cells with a sticky-bit cell to identify an overflow condition.

19. The apparatus of claim 1 wherein the data shift register comprises serially connected asynchronous flip flops.

20. The apparatus of claim 18 with a uniform set of input nodes and output nodes that form a ring oscillator strand.

* * * * *